(12) United States Patent
Tamura et al.

(10) Patent No.: US 8,293,660 B2
(45) Date of Patent: Oct. 23, 2012

(54) METHOD OF MANUFACTURING SEMICONDUCTOR DEVICE

(75) Inventors: Kei Tamura, Tokyo (JP); Koji Miyoshi, Tokyo (JP)

(73) Assignee: Mitsumi Electric Co., Ltd., Tokyo (JP)

(*) Notice: Subject to any disclaimer, the term of this patent is extended or adjusted under 35 U.S.C. 154(b) by 0 days.

(21) Appl. No.: 13/093,186

(22) Filed: Apr. 25, 2011

(65) Prior Publication Data

US 2011/0281425 A1 Nov. 17, 2011

(30) Foreign Application Priority Data

May 14, 2010 (JP) ................................ 2010-112552

(51) Int. Cl.
*H01L 21/31* (2006.01)

(52) U.S. Cl. .................. 438/783; 438/585; 257/E21.248

(58) Field of Classification Search ........... 257/E21.146, 257/E21.147, E21.148, E21.191, E21.247, 257/E21.37, E21.4, E21.487, E21.536

See application file for complete search history.

(56) References Cited

FOREIGN PATENT DOCUMENTS

| JP | 10012589 A | * | 1/1998 |
| JP | 10-256224 | | 9/1998 |

* cited by examiner

*Primary Examiner* — Cheung Lee
(74) *Attorney, Agent, or Firm* — IPUSA, PLLC

(57) ABSTRACT

A method of manufacturing a semiconductor device includes forming a photoresist pattern on an insulating film formed on a semiconductor substrate by applying a photoresist on the insulating film; processing the insulating film by removing an unnecessary portion of the insulating film by wet etching; and implanting ions into the insulating film before and/or after forming the photoresist pattern. In implanting the ions, the depth of a damaged region formed in the insulating film by implanting the ions is changed in accordance with the presence or absence of the photoresist pattern.

5 Claims, 11 Drawing Sheets

METHOD OF MANUFACTURING SEMICONDUCTOR DEVICE

CROSS-REFERENCE TO RELATED APPLICATION

The present application is based upon and claims the benefit of priority of Japanese Patent Application No. 2010-112552, filed on May 14, 2010, the entire contents of which are incorporated herein by reference.

BACKGROUND OF THE INVENTION

1. Field of the Invention

The present invention relates generally to methods of manufacturing a semiconductor device, and more particularly to a method of manufacturing a semiconductor device including the step of forming a photoresist pattern on an insulating film formed on a semiconductor substrate and the step of processing the insulating film by removing its unnecessary portions by wet etching.

2. Description of the Related Art

Conventionally, a method of manufacturing a semiconductor device is known that includes at least the steps of forming a film on a semiconductor substrate; exposing the surface of the film to inert ions; and forming a resist film and patterning the film into a desired shape by wet etching. (See, for example, Japanese Laid-Open Patent Application No. 10-256224.)

Japanese Laid-Open Patent Application No. 10-256224 has an object of controlling permeation of an etchant at the interface between a resist and an interlayer film by increasing adhesion between the resist and the interlayer film and of preventing permeation of an etchant at the interface between interlayer films by increasing adhesion between the interlayer films.

SUMMARY OF THE INVENTION

According to an aspect of the present invention, a method of manufacturing a semiconductor device includes forming a photoresist pattern on an insulating film formed on a semiconductor substrate by applying a photoresist on the insulating film; processing the insulating film by removing an unnecessary portion of the insulating film by wet etching; and implanting ions into the insulating film at least one of before and after forming the photoresist pattern, wherein in implanting the ions, a depth of a damaged region formed in the insulating film by the ion implantation is changed in accordance with a presence or absence of the photoresist pattern.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

In practice, the configuration described in Japanese Laid-Open Patent Application No. 10-256224 mentioned above has a problem in that while the adhesion between the resist and the interlayer film is increased, the interlayer film is damaged by exposure to inert ions to allow wet etching to overly progress so that a more etched shape than is desired is formed as a pattern.

Figure 1:
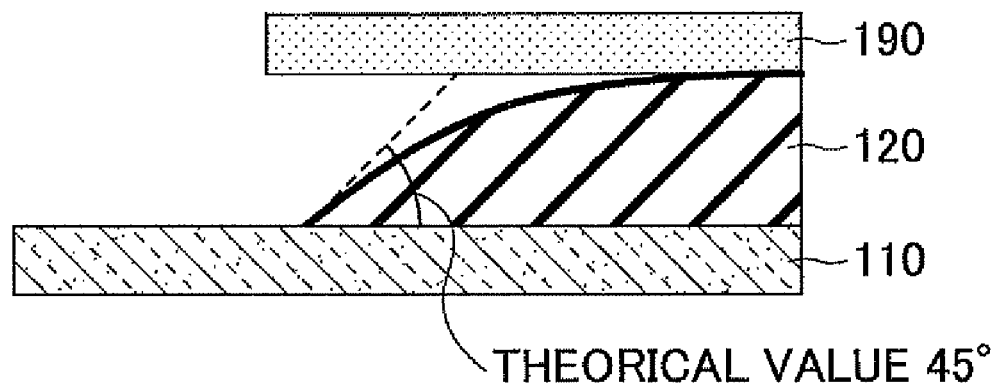
FIG. 1 is a diagram for illustrating problems of conventional wet etching.

FIG. 1 is a diagram for illustrating a problem of the conventional semiconductor device manufacturing method using wet etching. FIG. 1 illustrates a state where an insulating film 120 is formed on a semiconductor substrate 110 and a resist 190 is formed on the insulating film 120. The wet etching of the insulating film 120, which is based on an oxide film, is isotropic. Therefore, the theoretical value of a finished taper angle is 45 degrees, which is indicated by a broken line in FIG. 1. In practice, however, near the interface with a resist, etching tends to extend in the direction of the interface (in a lateral direction in FIG. 1), so that the taper angle is often less than or equal to 40 degrees (as indicated by the solid line of the insulating film 120). It is presumed that this is because miniaturization of a pattern causes the same phenomenon as capillarity to occur at the resist interface so that a wet etching agent spreads more toward a narrow region. Further, addition of a surfactant or the like for better spreadability of the wet etching agent is presumed to be another acceleration factor. Thus, according to the conventional semiconductor device manufacturing method using wet etching, there is a problem in that the difference between the taper angle and its theoretical value causes the insulating film 120 to be obtained in a smaller area than is required by design to adversely affect product characteristics. Further, there is also a problem in that variations in the taper angle may occur in a wafer plane, presumably because of variations in the adhesion between the insulating film 120 and the resist 190, thus resulting in inability to perform desired control in spite of countermeasures taken, such as additional cleaning.

To sum up, the conventional method of manufacturing a semiconductor device using wet etching has a problem in that the taper angle after wet etching is less than 45 degrees and unstable and that the taper angle after wet etching varies greatly in a wafer plane.

According to Japanese Laid-Open Patent Application No. 10-256224 mentioned above, inert ions are irradiated in order to strengthen adhesion between the insulating film 120 and the resist 190. In practice, however, the irradiation of inert ions, although increasing the adhesion, also leaves great damage to the insulating film 120. Therefore, the problems illustrated in FIG. 1 cannot be solved.

On the other hand, in semiconductor processes, it has been mainstream processing to form a gradual taper shape near the interface with a resist as indicated by the solid line in FIG. 1 in the conventional low-voltage large-scale integrated (LSI) circuit because sharp interconnection after wet etching causes problems such as an open circuit. However, as a result of recent emergence of a demand for the manufacture of high-voltage MOS (metal oxide semiconductor) transistors and micro-electro-mechanical systems (MEMS), priority has been given to ensuring a great difference in level in products, so that the insulating film 120 has been desired to have a linearly tapered shape with a taper angle of 45 degrees or more.

According to an aspect of the present invention, a method of manufacturing a semiconductor device is provided that makes it possible to provide an insulating film with a taper angle of 45 degrees or more after wet etching, to ensure a linearly tapered shape for the insulating film, and further to prevent variations in the taper angle in a semiconductor substrate plane.

A description is given, with reference to the accompanying drawings, of embodiments of the present invention.

[First Embodiment]

FIGS. 2A through 2D are diagrams illustrating a method of manufacturing a semiconductor device according to a first embodiment of the present invention.

Figure 2A:
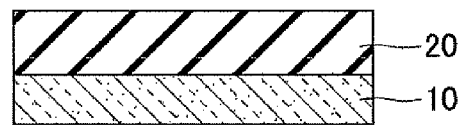
FIG. 2A is a diagram illustrating an insulating film forming process according to a semiconductor device manufacturing method of a first embodiment of the present invention.

FIG. 2A is a diagram illustrating an insulating film forming process according to the semiconductor device manufacturing method of the first embodiment. In the insulating film forming process, an insulating film (layer) 20 is formed on a semiconductor substrate 10.

For the semiconductor substrate 10, substrates of various semiconductor materials may be used, such as a silicon substrate, a semiconductor substrate of gallium arsenide (GaAs), and a semiconductor substrate of silicon carbide (SiC). In this embodiment, by way of example, a description is given of the case of using a silicon substrate as the semiconductor substrate 10. The semiconductor substrate 10 may also be referred to as "wafer 10."

The material of the insulating film 20 and the method of forming the insulating film 20 on the semiconductor substrate may vary. For example, the insulating film 20 may be a thermal oxide film formed by heating the semiconductor substrate 10. For example, the thermal oxide film is a $SiO_2$ film when the semiconductor substrate 10 is a silicon substrate. Other examples of the insulating film 20 may include various insulating films formed by chemical vapor deposition or the like.

Figure 2B:
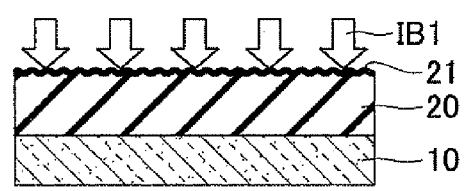
FIG. 2B is a diagram illustrating an ion implantation process according to the semiconductor device manufacturing method of the first embodiment of the present invention.

FIG. 2B is a diagram illustrating an ion implantation process according to the semiconductor device manufacturing method of the first embodiment. In the ion implantation process, the entire surface of the insulating film 20 is exposed to an ion beam IB1 to activate only the surface of the insulating film 20 whose adhesion to a resist is to be increased, so that a damaged region 21 is formed at the surface of the insulating film 20.

Figure 3:
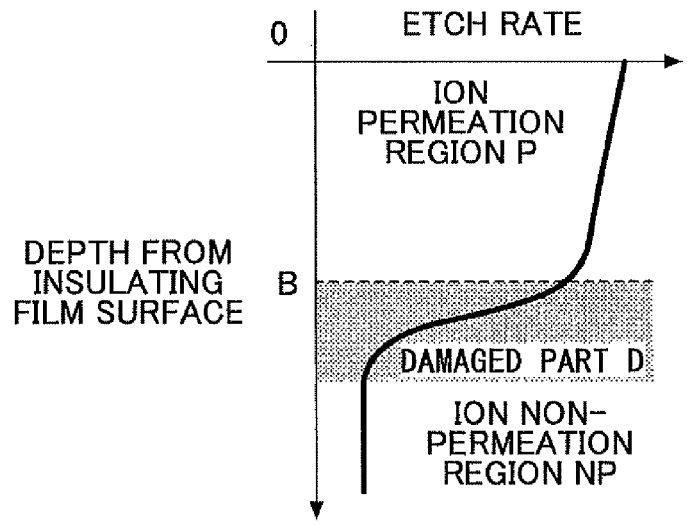
FIG. 3 is a graph for illustrating a distribution of wet etching rate variations due to ion implantation according to the first embodiment of the present invention.

FIG. 3 is a graph for illustrating a distribution of wet etching rate variations due to ion implantation. In FIG. 3, the horizontal axis represents etching rate and the vertical axis represents depth from the insulating film surface. As the depth becomes larger, the depth is indicated lower on the vertical axis with the surface of the insulating film 20 being the origin.

In FIG. 3, when consideration is given based on the vertical axis, the region directly under the surface of the insulating film 20 is an ion penteation region P. In the ion permeation region P, a layer of a damaged $SiO_2$ lattice or the like (damaged region) 21 is generated because of ion collision. Active reaction is present in the damaged layer 21 because of non-covalent bonds of Si, highly-strained Si—O bonds, etc. Accordingly, the wet etching rate is high in the damaged layer 21 as illustrated in FIG. 3.

In FIG. 3, an ion non-permeation region NP deeper than B is a region that does not allow permeation of implanted ions. However, stress is induced by ion implantation in a region near the ion permeation region P in the ion non-permeation region NP. In FIG. 3, such part affected with induced stress is referred to as "damaged part D." The condition of the damaged part D is such that a sudden change occurs in the etching rate. On the other hand, the etching rate becomes normal in the part deeper than the damaged part D.

Based on the behavior illustrated in FIG. 3, it is the ion permeation region P where the insulating film 20 is activated by ion implantation so that its surface condition changes. As a result of the activation and change of the surface condition of the insulating film 20, the insulating film 20 is better in resist adhesion than at an untreated time. On the other hand, the rate of wet etching is high in the ion permeation region P. Therefore, if the ion permeation region P is set deep, etching also progresses in lateral directions, so that a taper angle close to the theoretical value of 45 degrees is not obtained.

Therefore, according to the semiconductor device manufacturing method of the first embodiment, ion implantation is performed so that the ion permeation region P, which becomes the damaged region 21, is only at the surface of the insulating film 20. That is, before application of a resist, only the surface to contact the resist to be applied is activated, and the damaged region 21 is prevented from being formed in a region deeper than the surface. This makes it possible to increase adhesion between the insulating film 20 and the resist. This also makes it possible to prevent wet etching from laterally progressing at the interface with the resist, so that it is possible to obtain a linearly tapered shape having a taper angle close to the theoretical value of 45 degrees.

The ion permeation region P to become the damaged region 21 of the insulating film 20 is less than 10 nm deep from the surface of the insulating film 20. The depth of the ion permeation region P may be suitably determined in accordance with a purpose of use. For example, the ion permeation region P may also be less than 8 nm deep or less than 6 nm deep from the surface of the insulating film 20. The ion permeation region P is fully adjustable to these depths with present ion implantation techniques, and it has been experimentally verified that these depths are well within settable ranges. Further, even when the ion permeation region P is set as close to the surface of the insulating film 20 as possible like a film, a damaged part of approximately 1 nm deep is believed to be generated. Therefore, the ion permeation region P is at least approximately 1 nm deep from the surface of the insulating film 20. That is, the ion permeation region P may be set to have, for example, a depth ranging from approximately 1 nm to less than 10 nm, a depth ranging from approximately 1 nm to less than 8 nm, or a depth ranging from approximately 1 nm to less than 6 nm from the surface of the insulating film 20.

Figure 4:
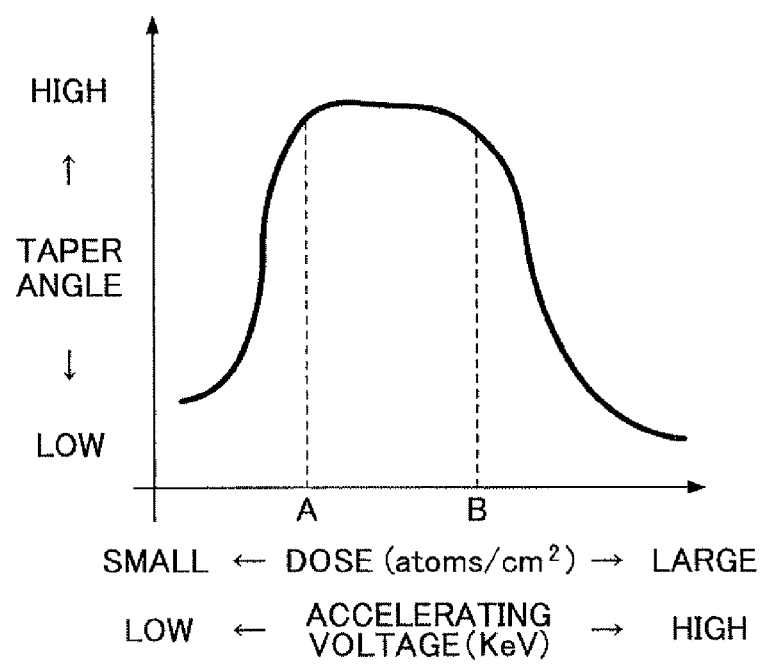
FIG. 4 is a graph illustrating a relationship between ion beam conditions and taper angle dependence in the case of performing ion implantation before application of a resist according to the first embodiment of the present invention.

FIG. 4 is a graph illustrating a relationship between ion beam conditions and taper angle dependence in the case of performing ion implantation before application of a resist. In FIG. 4, the horizontal axis represents the dose (atoms/$cm^2$) and the accelerating voltage (KeV) of an ion beam to be irradiated, and the vertical axis represents the taper angle of the insulating film 20. The taper angle shows the taper angle dependence that the taper angle is low when the dose is small and the accelerating voltage is low and when the dose is large and the accelerating voltage is high, and is high when the dose and the accelerating voltage are in a predetermined intermediate range (between A and B in FIG. 4). Such taper angle dependence allows a high taper angle to be obtained by, for example, setting the dose and the accelerating voltage of an ion beam in the A-B range. Since the A-B range is wide and there are two parameters to be controlled, the dose and the accelerating voltage, the conditions of ion implantation are easily set within the A-B range by adjusting and setting the dose and the accelerating voltage.

Various kinds of ions may be used for the ion implantation. For example, a noble gas such as He, Ne, Ar, Kr, or Xe may be used so that there is no effect on a device. For example, if the ion species is Ar, such an adjustment is made as to cause the ion permeation region P to be only in the surface layer of the insulating film 20 by determining the conditions of ion implantation so that the accelerating voltage is less than or equal to approximately 50 KeV and the dose is less than or equal to approximately $5 \times 10^{13}$ atoms/$cm^2$. Thereafter, a photoresist is applied. As a result, the insulating film 20 is better in resist adhesion than at an untreated time, and capillarity at the time of wet etching is suppressed. Further, a linearly tapered shape is obtained, a high taper angle of approximately 45 degrees is ensured, and the taper angle is prevented from varying in the plane of the semiconductor substrate 10.

However, if the conditions of ion implantation are excessive, wet etching excessively progresses toward the interface between the insulating film 20 and the resist so that the taper angle is less than 40 degrees, although the adhesion to the resist is improved. Therefore, it is desired to adjust the conditions of ion implantation on the basis of the film kind of the insulating film 20.

Thus, by activating the surface of the insulating film 20 by forming the damaged region 21 only in a film part near the surface of the insulating film 20 by suitably determining the conditions of an ion beam in ion implantation, it is possible to prevent the wet etching rate of the insulating film 20 from increasing while increasing the adhesion to the resist, so that it is possible to obtain a linear taper angle close to 45 degrees.

In FIG. 4, by way of example, a description is given of the case of determining the conditions of ion implantation using the dose and the accelerating voltage of an ion beam as control parameters. Alternatively, if it is possible to control the depth of the damaged region 21 in ion implantation using other parameters, an adjustment may also be made using such other parameters.

Referring back to FIG. 2B, in the ion implantation process of FIG. 2B, as illustrated in FIG. 3 and FIG. 4, the conditions of the ion beam IB1 are determined so that the damaged region 21 of the insulating film 20 is less than 10 nm deep from the surface of the insulating film 20, and ion implantation is performed by exposing the entire surface of the insulating film 20 to the ion beam IB1. As a result, in the insulating film 20, a region as deep as or deeper than 10 nm from the surface is free of damage, and only the surface (including a region up to less than 10 nm deep from the surface) of the insulating film 20 is activated.

Figure 2C:
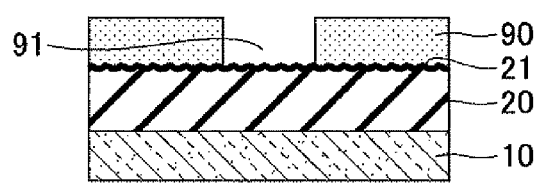
FIG. 2C is a diagram illustrating a photoresist pattern forming process according to the semiconductor device manufacturing method of the first embodiment of the present invention.

FIG. 2C is a diagram illustrating a photoresist pattern forming process according to the semiconductor device manufacturing method of the first embodiment. In the photoresist pattern forming process, a photoresist is applied on the surface of the insulating film 20, and unnecessary portions of the photoresist are removed through exposure to light and development, so that a photoresist pattern 90 having an opening 91 is formed. As illustrated in FIG. 2B, the damaged region 21 is formed at the surface of the insulating film 20 so that the surface of the insulating film 20 is activated. Therefore, the photoresist pattern 90 is formed with extremely high adhesion between the photoresist pattern 90 and the insulating film 20.

Figure 2D:
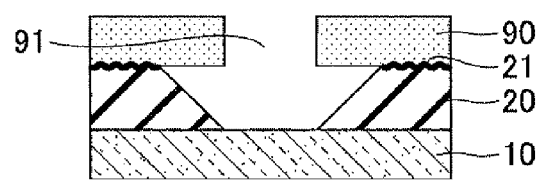
FIG. 2D is a diagram illustrating a wet etching process according to the semiconductor device manufacturing method of the first embodiment of the present invention.

FIG. 2D is a diagram illustrating a wet etching process according to the semiconductor device manufacturing method of the first embodiment. In the wet etching process, an etchant is fed to the insulating film 20 covered with the resist pattern 90, so that in the opening 91, which is not covered with the photoresist pattern 90, the etchant comes into contact with the insulating film 20 to etch the insulating film 20. The method of feeding the etchant may vary. For example, the semiconductor substrate 10 on which the insulating film 20 is formed may be immersed in the etchant contained in an etching bath, or the etchant may be sprayed from above the photoresist pattern 90 with a nozzle or the like.

By the wet etching process, unnecessary portions of the insulating film 20 are removed, so that the insulating film 20 is processed into a desired shape. At this point, high adhesion between the photoresist pattern 90 and the insulating film 20 prevents etching from excessively progressing at the interface between the resist pattern 90 and the insulating film 20. Further, since the insulating film 20 has a normal etching rate, etching is performed at an etching rate close to a theoretical value. As a result, as illustrated in FIG. 2D, the insulating film 20 has a linearly tapered shape with a taper angle of substantially 45 degrees.

Thus, according to the semiconductor device manufacturing method of the first embodiment, the photoresist pattern forming process is preceded by the ion implantation process. In the ion implantation process, the adhesion between the surface of the insulating film 20 and the photoresist pattern 90 is increased, and ion implantation is performed without damaging the insulating film 20 except for its surface. Thereby, it is possible to perform such processing as to obtain the insulating film 20 having a high taper angle.

[Second Embodiment]

FIGS. 5A through 5D are diagrams illustrating a method of manufacturing a semiconductor device according to a second embodiment of the present invention. In the second embodiment, the same elements as those described in the first embodiment are referred to by the same reference characters, and a description thereof is omitted.

Figure 5A:
FIG. 5A is a diagram illustrating an insulating film forming process according to a semiconductor device manufacturing method of a second embodiment of the present invention.

FIG. 5A is a diagram illustrating an insulating film forming process according to the semiconductor device manufacturing method of the second embodiment. The insulating film forming process is the same as the process of FIG. 2A of the first embodiment, and accordingly, a description thereof is omitted.

Figure 5B:
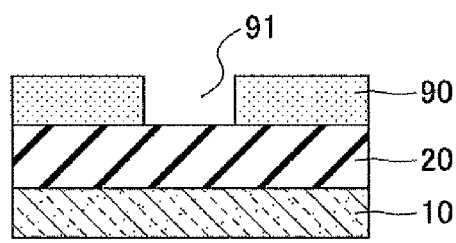
FIG. 5B is a diagram illustrating a photoresist pattern forming process according to the semiconductor device manufacturing method of the second embodiment of the present invention.

FIG. 5B is a diagram illustrating a photoresist pattern forming process according to the semiconductor device manufacturing method of the second embodiment. In the photoresist pattern forming process, a photoresist is applied on the insulating film 20 provided on the semiconductor substrate 10, and unnecessary portions of the photoresist are removed through exposure to light and development, so that the photoresist pattern 90 having the opening 91 is formed.

Here, according to the semiconductor device manufacturing method of the second embodiment, the photoresist pattern forming process is not preceded by an ion implantation process. Accordingly, a photoresist is applied and the photoresist pattern 90 is formed on the surface, not activated in particular, of the insulating film 20 in a normal state.

Figure 5C:
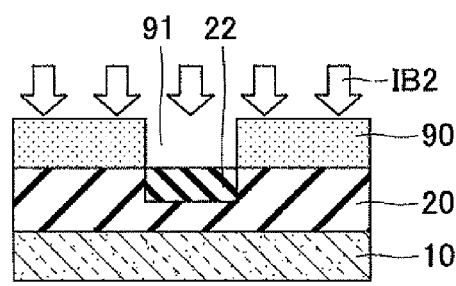
FIG. 5C is a diagram illustrating an ion implantation process according to the semiconductor device manufacturing method of the second embodiment of the present invention.

FIG. 5C is a diagram illustrating an ion implantation process according to the semiconductor device manufacturing method of the second embodiment. In the ion implantation process, an ion beam IB2 is emitted onto and ions are implanted in an exposed part of the insulating film 20 located in the opening 91 of the photoresist pattern. According to the semiconductor device manufacturing method of the second embodiment, the ion implantation process follows the photoresist pattern forming process. According to the ion implantation in this case, the ion beam IB2 is emitted so that the damaged region 22 is generated not only at the surface of the insulating film 20 but also inside the insulating film 20. Accordingly, the damaged region 22 is formed to have a depth of 10 nm or more from the surface of the insulating film 20 within the depth of an unnecessary portion of the insulating film. In general, in the case where the semiconductor substrate 10 is under the insulating film 20, the unnecessary portion of the insulating film 20 is a region whose removal exposes the semiconductor substrate 10, that is, the thickness of the insulating film 20. Therefore, the damaged region 22 is formed to have a depth suitably determined to be 10 nm or more. As illustrated in FIG. 3, the damaged region 22 of the insulating film 20 is the ion permeation region P. Therefore, the conditions of ion implantation may be determined so that the ion permeation region P has a depth of 10 nm or more from the surface of the insulating film 20.

Figure 6:
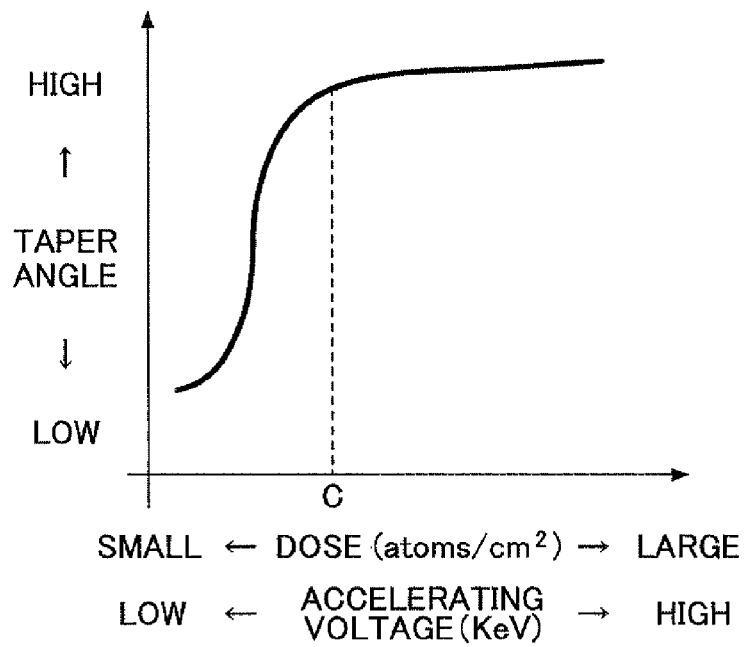
FIG. 6 is a graph illustrating a relationship between ion beam conditions and taper angle dependence in the case of performing ion implantation after formation of a resist pattern according to the second embodiment of the present invention.

FIG. 6 is a graph illustrating a relationship between the conditions of the ion beam IB2 and taper angle dependence in the case of performing ion implantation after formation of a resist pattern. In FIG. 6, the horizontal axis represents the dose (atoms/cm$^2$) and the accelerating voltage (KeV) of the ion beam IB2, and the vertical axis represents the size of the taper angle of the shape of the insulating film 20.

FIG. 6 shows the taper angle dependence that the taper angle is low in a range where the dose is small and the accelerating voltage is low, and the taper angle increases as the dose and the accelerating voltage increase so that the taper angle saturates with a certain dose and a certain accelerating voltage. Therefore, for example, a high taper angle is obtained by making the dose and the accelerating voltage larger and higher, respectively, than C.

Like in the first embodiment, various kinds of ions may be used for the ion implantation. For example, a noble gas such as He, Ne, Ar, Kr, or Xe may be used so that there is no effect on a device. For example, if the ion species is Ar, the conditions of the ion beam IB2 in ion implantation are an accelerating voltage of approximately 100 KeV or more and a dose of approximately $1.0 \times 10^{14}$ atoms/cm$^2$ or more. Thus, it is preferable to adjust ion beam conditions so that a desired taper angle is obtained. However, it is desirable to check the film thickness of the photoresist pattern 90 in advance because ions may permeate the photoresist pattern 90 unless the film thickness of the photoresist pattern 90 is greater than the theoretical range of the ion species. Further, at the time of implanting ions, the semiconductor substrate 10 is processed in not a normal-pressure but a low-pressure condition. Therefore, a solvent and the like in the photoresist vaporize to increase adhesion to the insulating film 20.

Further, in FIG. 6, by way of example, a description is given of the case of employing a dose and accelerating voltage as parameters for controlling the taper angle. Alternatively, other parameters may be used if it is possible to control the conditions of ion implantation by adjusting the other parameters.

Referring back to FIG. 5C, ion implantation is performed with the conditions of the ion beam 152 as illustrated in FIG. 6, so that the damaged region 22 is formed as deep as a position deeper than the surface of the insulating film 20 to be activated.

As illustrated in FIG. 6, the height (size) of the taper angle is substantially constant where the dose and the accelerating voltage are greater than or equal to certain values. Therefore, it is believed to be possible to fouu a shape having a predetermined taper angle by forming the damaged region 22 to a certain depth if not to the neighborhood of the bottom surface of the insulating film 20.

Further, according to the semiconductor device manufacturing method of the second embodiment, ion implantation is performed only on part of the insulating film 20 to be etched. Therefore, it is possible to control the range of etching rates with implantation conditions. As a result, it is possible to control the taper angle, so that it is possible to control the taper angle of the processed shape of the insulating film 20 within the range of approximately 45 degrees to 65 degrees.

Figure 5D:
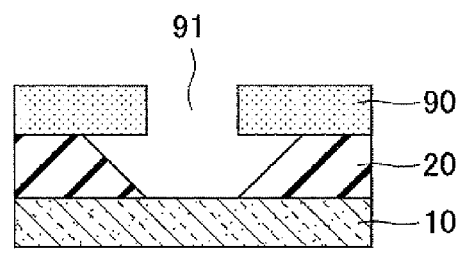
FIG. 5D is a diagram illustrating a wet etching process according to the semiconductor device manufacturing method of the second embodiment of the present invention.

FIG. 5D is a diagram illustrating a wet etching process according to the semiconductor device manufacturing method of the second embodiment. The wet etching process is the same as illustrated in FIG. 2D of the first embodiment, and accordingly, its details are omitted. According to the semiconductor device manufacturing method of the second embodiment, the adhesion between the photoresist pattern 90 and the insulating film 20 is not increased in particular. However, since the damaged region 22 is formed at a position (exposed part) in the insulating film 20 corresponding to the opening 91 of the photoresist pattern 90, the etching vertically progresses faster so that it is possible to complete the wet etching process before the etching excessively progresses laterally. Therefore, it is possible to obtain the shape of the insulating film 20, linear with a large taper angle, as illustrated in FIG. 5D.

According to the semiconductor device manufacturing method of the second embodiment, the photoresist pattern forming process is followed by the ion implantation process, so that the damaged region 22 deeper than the surface of the insulating film 20 is formed only in part of the insulating film 20 to be removed. As a result, it is possible to ensure a linearly tapered shape and a high taper angle of 45 degrees to 65 degrees, and also to prevent variations of the taper angle in the plane of the semiconductor substrate 10.

[Third Embodiment]

FIGS. 7A through 7E are diagrams illustrating a method of manufacturing a semiconductor device according to a third embodiment of the present invention. In FIGS. 7A through 7E, the same elements as those of the first embodiment and the second embodiment are referred to by the same reference characters, and a description thereof is omitted.

Figure 7A:
FIG. 7A is a diagram illustrating an insulating film forming process according to a semiconductor device manufacturing method of a third embodiment of the present invention.

FIG. 7A is a diagram illustrating an insulating film forming process according to the semiconductor device manufacturing method of the third embodiment. The insulating film forming process is the same as the process of FIG. 2A of the first embodiment. Therefore, the elements are referred to by the same reference characters as in FIG. 2A, and a description thereof is omitted.

Figure 7B:
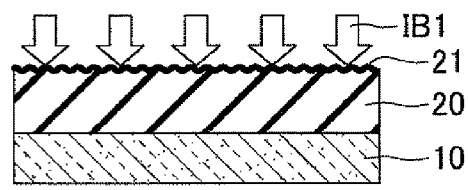
FIG. 7B is a diagram illustrating a first ion implantation process according to the semiconductor device manufacturing method of the third embodiment of the present invention.

FIG. 7B is a diagram illustrating a first ion implantation process according to the semiconductor device manufacturing method of the third embodiment. The first ion implantation process, which is the same as the process of FIG. 2B of the first embodiment, is given the same reference characters as in FIG. 2B, and a description thereof is omitted.

By the first ion implantation process, it is possible to activate the surface of the insulating film 20 before formation of the photoresist pattern 90, so that it is possible to increase its adhesion to the photoresist pattern 90.

Figure 7C:
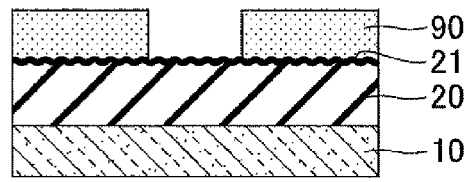
FIG. 7C is a diagram illustrating a photoresist pattern forming process according to the semiconductor device manufacturing method of the third embodiment of the present invention.

FIG. 7C is a diagram illustrating a photoresist pattern forming process according to the semiconductor device manufacturing method of the third embodiment. The photoresist pattern forming process, which is the same as the process of FIG. 2C of the first embodiment, is given the same reference characters as in FIG. 2C, and a description thereof is omitted.

Figure 7D:
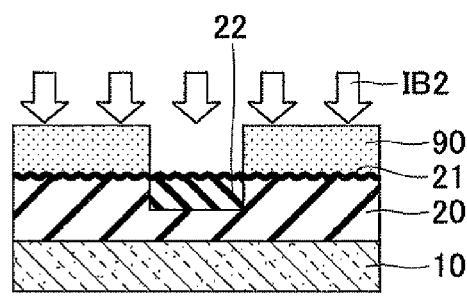
FIG. 7D is a diagram illustrating a second ion implantation process according to the semiconductor device manufacturing method of the third embodiment of the present invention.

FIG. 7D is a diagram illustrating a second ion implantation process according to the semiconductor device manufacturing method of the third embodiment. The semiconductor device manufacturing method of the third embodiment is different from the semiconductor device manufacturing methods of the first embodiment and the second embodiment in that the first ion implantation process before the photoresist pattern forming process and the second ion implantation process after the photoresist pattern forming process are provided.

The second ion implantation process, which is a process of irradiating the exposed part of the insulating film 20 with the ion beam IB2, forms the damaged region 22 to a position deeper than the surface of the insulating film 20. That is, the second ion implantation process is the same as the ion implantation process described in the second embodiment. This causes such a change in state as to increase the wet etching rate of the insulating film 20.

Thus, according to the semiconductor device manufacturing method of the third embodiment, the first ion implantation process increases adhesion between the photoresist pattern 90 and the surface of the insulating film 20, and the second ion implantation process causes such a change in state as to increase the etching rate of part of the insulating film 20 to be removed.

The details of the second ion implantation process are the same as those illustrated in FIG. 5C of the second embodiment. Therefore, the same elements as those of FIG. 5C are referred to by the same reference characters, and a description thereof is omitted.

Figure 7E:
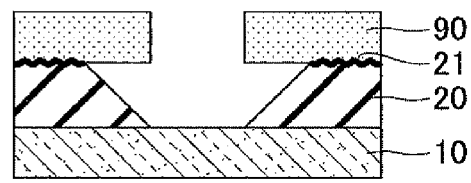
FIG. 7E is a diagram illustrating a wet etching process according to the semiconductor device manufacturing method of the third embodiment of the present invention.

FIG. 7E is a diagram illustrating a wet etching process according to the semiconductor device manufacturing method of the third embodiment. In the wet etching process, wet etching is performed so that unnecessary portions of the insulating film 20 are removed. Since the adhesion between the insulating film 20 and the photoresist pattern 90 has been increased by the first ion implantation process and the etching rate of the insulating film 20 has been increased by the second ion implantation process, the etching is prevented from spreading laterally, and progresses in the depth direction. As a result, it is possible to control the taper angle so that the tapered shape is linear and the taper angle is in a range of approximately 45 degrees to approximately 65 degrees as illustrated in FIG. 7E.

The details of the wet etching process are the same as those illustrated in FIG. 2D of the first embodiment. Therefore, the same elements are referred to by the same reference characters, and a description thereof is omitted.

According to the semiconductor device manufacturing method of the third embodiment, the first ion implantation process, which increases adhesion between the photoresist pattern 90 and the surface of the insulating film 20 to prevent variations of the taper angle of the insulating film 20 in a wafer plane, and the second ion implantation process, which makes it possible to control the taper angle of the insulating film 20, are combined to generate a synergistic effect, so that it is possible to ensure that the processed shape of the insulating film 20 has a taper angle of 45 degrees or more and to prevent in-plane variations of the taper angle.

[Fourth Embodiment]

FIGS. 8A through 8H are diagrams illustrating a method of manufacturing a semiconductor device according to a fourth embodiment of the present invention. In the fourth embodiment, a description is given of the case of applying the semiconductor device manufacturing method according to the first, second, or third embodiment to a method of manufacturing a high-voltage device, which is a specific example of the semiconductor device. In FIGS. 8A through 8H, as a typical example, a description is given of the case of applying the semiconductor device manufacturing method according to the third embodiment to the high-voltage device manufacturing method. Each of the semiconductor device manufacturing methods of the first embodiment and the second embodiment is a manufacturing method that omits either the first ion implantation process or the second ion implantation process. Therefore, the case of their applications is described after the description of the case of application of the third embodiment.

Figure 8A:
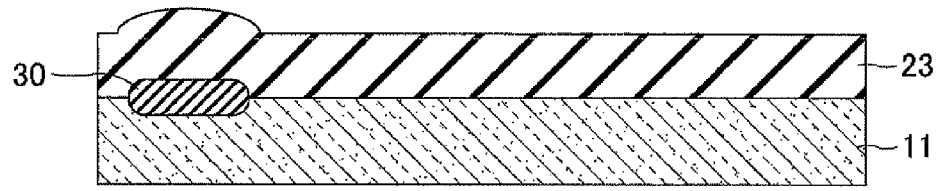
FIG. 8A is a diagram illustrating an isolation and thermal oxide film forming process according to a semiconductor device manufacturing method of a fourth embodiment of the present invention.

FIG. 8A is a diagram illustrating an isolation and thermal oxide film forming process according to the semiconductor device manufacturing method of the fourth embodiment. In the isolation and thermal oxide film forming process, an isolation 30 is first formed on a semiconductor substrate 11, and a thermal oxide film 23 is then formed on the semiconductor substrate 11 and the isolation 30. This process corresponds to the insulating film forming processes of the first through third embodiments.

As described in the first embodiment, substrates of various materials, such as a silicon substrate, may be used for the semiconductor substrate 11.

The isolation 30, which is an insulating region used for isolation between semiconductor devices, may be formed by, for example, local oxidation of silicon (LOCOS).

The thermal oxidation film 23 is an insulating film formed by heating the semiconductor substrate 11. For example, the thermal oxide film 23 is $SiO_2$ when the semiconductor substrate 11 is a silicon substrate.

Figure 8B:
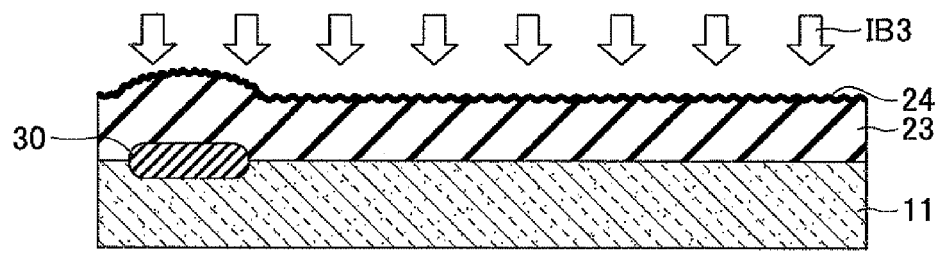
FIG. 8B is a diagram illustrating a first ion implantation process according to the semiconductor device manufacturing method of the fourth embodiment of the present invention.

FIG. 8B is a diagram illustrating a first ion implantation process according to the semiconductor device manufacturing method of the fourth embodiment. In the first ion implantation process, ion implantation is performed by irradiating the entire surface of the thermal oxide film 23 with an ion beam 153. This process is the same as the processes of FIG. 2B of the first embodiment and FIG. 7B of the third embodiment, and the ion implantation is performed with the ion beam conditions illustrated in FIG. 2B and FIG. 7B. As a result, an activated damaged region 24 is formed near the surface of the thermal oxide film 23.

Figure 8C:
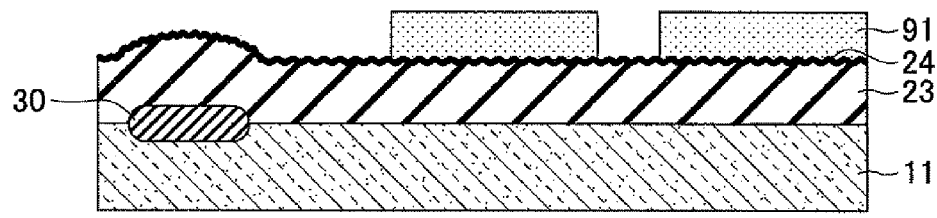
FIG. 8C is a diagram illustrating a photoresist pattern forming process according to the semiconductor device manufacturing method of the fourth embodiment of the present invention.

FIG. 8C is a diagram illustrating a photoresist pattern forming process according to the semiconductor device manufacturing method of the fourth embodiment. In the photoresist pattern forming process, a photoresist is applied on the thermal oxide film 23, and is formed into a desired photoresist pattern 91 through exposure to light and development. This process corresponds to the photoresist pattern forming processes of the first through third embodiments.

Figure 8D:
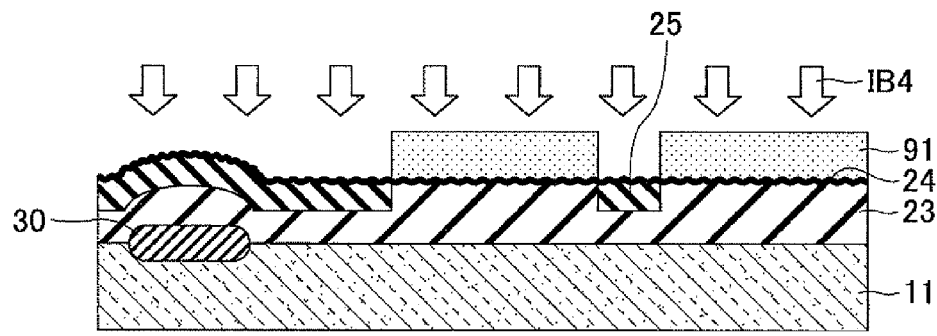
FIG. 8D is a diagram illustrating a second ion implantation process according to the semiconductor device manufacturing method of the fourth embodiment of the present invention.

FIG. 8D is a diagram illustrating a second ion implantation process according to the semiconductor device manufacturing method of the fourth embodiment. In the second ion implantation process, ion implantation is performed by irradiating an exposed part of the thermal oxide film 23 with an ion beam 184. This process corresponds to the processes of FIG. 5C of the second embodiment and FIG. 7D of the third embodiment, and the ion implantation is performed with the ion beam conditions illustrated in the second embodiment and the third embodiment. As a result, a damaged region 25 is formed inside the thermal oxide film 23 so as to reach a position deeper than or equal to 10 nm from the surface of the thermal oxide film 23. As a result of this process, it is possible to control the taper angle.

Figure 8E:
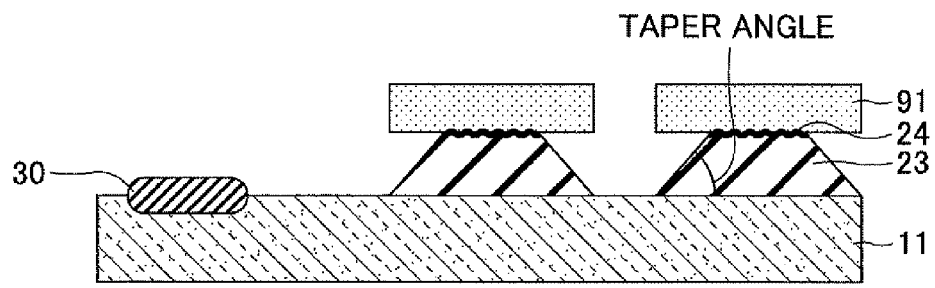
FIG. 8E is a diagram illustrating a wet etching process according to the semiconductor device manufacturing method of the fourth embodiment of the present invention.

FIG. 8E is a diagram illustrating a wet etching process according to the semiconductor device manufacturing method of the fourth embodiment. In the wet etching process, the thermal oxide film 23 is etched using an etchant, so that unnecessary portions of the thermal oxide film 23 are removed. The adhesion between the photoresist pattern 91 and the thermal oxide film 23 has been improved in the first ion implantation process, and the taper angle of the thermal oxide film 23 has been controlled to be a desired high angle in the second ion implantation process. Therefore, in the wet etching process, the shape of the thermal oxide film 23 as illustrated in FIG. 8E, which is a linearly tapered shape with a high taper angle of 45 degrees or more, is obtained.

Figure 8F:
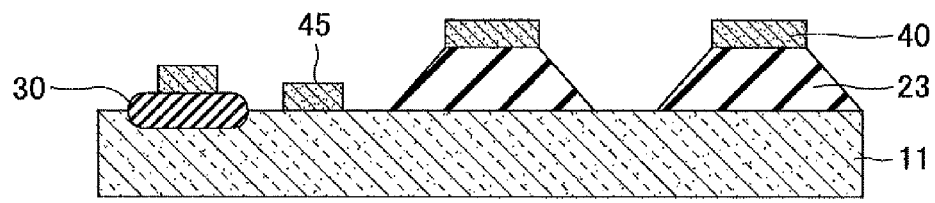
FIG. 8F is a diagram illustrating a gate forming process according to the semiconductor device manufacturing method of the fourth embodiment of the present invention.

FIG. 8F is a diagram illustrating a gate forming process according to the semiconductor device manufacturing method of the fourth embodiment. In the gate forming process, after removal of the photoresist pattern 91, high-voltage gates 40 are formed on the processed thermal oxide film 23, and low-voltage gates 45 are formed on the semiconductor substrate 11 and the isolation 30.

Figure 8G:
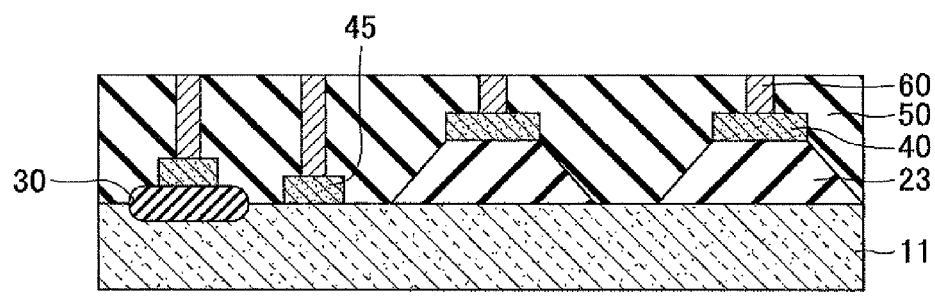
FIG. 8G is a diagram illustrating an interlayer film forming and contact hole forming process according to the semiconductor device manufacturing method of the fourth embodiment of the present invention.

FIG. 8G is a diagram illustrating an interlayer film forming and contact hole forming process according to the semiconductor device manufacturing method of the fourth embodiment. In the interlayer film forming and contact hole forming process, an interlayer film 50 is formed and contact holes 60 are formed inside the interlayer film 50.

Figure 8H:
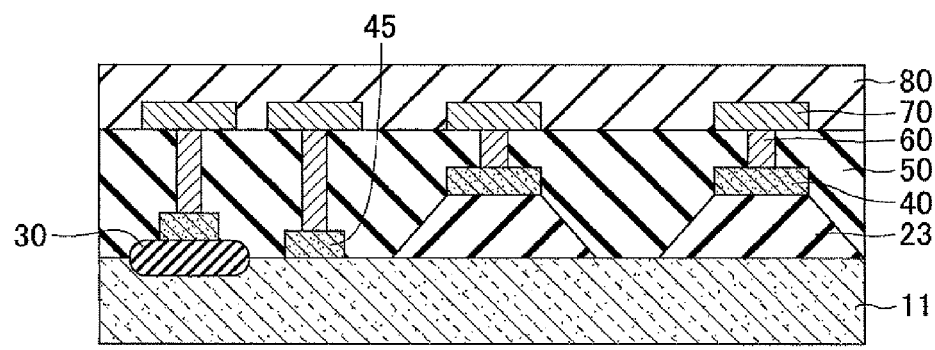
FIG. 8H is a diagram illustrating an interconnection layer forming and protection film forming process according to the semiconductor device manufacturing method of the fourth embodiment of the present invention.

FIG. 8H is a diagram illustrating an interconnection layer forming and protection film forming process according to the semiconductor device manufacturing method of the fourth embodiment. In the interconnection layer forming and protection film forming process, an interconnection layer 70 is formed on the contact holes 60 formed in the interlayer film 50, and a protection film 80 covering the interconnection layer 70 is then formed. Thereby, a high-voltage device is completed. That is, high-voltage MOS transistors corresponding to the high-voltage gates 40 and common MOS transistors corresponding to the low-voltage gates 45 are formed on the semiconductor substrate 11.

Here, the high-voltage gates 40 are formed on the processed thermal oxide film 23, which has a linearly tapered shape with a high taper angle. Therefore, it is possible to ensure a flat space sufficient for formation of the high-voltage gates 40 at the top of the thermal oxide film 23. If the processed thermal oxide film 23 has a low taper angle and a gently-sloping shape, it is impossible to ensure the flat space on which the high-voltage gates 40 are to be formed, so that it is impossible to deal with the manufacture of high-voltage devices.

Thus, according to the semiconductor device manufacturing method of the fourth embodiment, it is possible to linearize the taper shape of the thermal oxide film 23 and to process the thermal oxide film 23 into a shape having a high taper angle, so that it is possible to deal with the manufacture of high-voltage devices.

In the case of applying the semiconductor device manufacturing method according to the first embodiment to the fourth embodiment, the second ion implantation process of FIG. 8D may be omitted. In the case of applying the semiconductor device manufacturing method according to the second embodiment to the fourth embodiment, the first ion implantation process of FIG. 8B may be omitted. If it is possible to realize a desired taper angle with one of the ion implantation processes, a simpler manufacturing method is advantageous. Thus, one of the ion implantation processes may be omitted in accordance with a purpose of use and characteristics.

According to the semiconductor device manufacturing method of the fourth embodiment, it is possible to process the thermal oxide film 23 while ensuring sufficient space for forming the high-voltage gates 40, so that it is possible to manufacture a high-voltage device having good characteristics.

[Fifth Embodiment]

FIGS. 9A through 9I are diagrams illustrating a series of processes of a method of manufacturing a semiconductor device according to a fifth embodiment of the present invention. In the fifth embodiment, a description is given of the case of applying the semiconductor device manufacturing method of the first, second, or third embodiment to a method of manufacturing a MEMS large-step device. Like in the fourth embodiment, in FIGS. 9A through 9I, as a typical example, a description is given of the case of applying the semiconductor device manufacturing method of the third embodiment to the MEMS large-step device manufacturing method, and a description is given thereafter of the case of applying the semiconductor device manufacturing method of the first embodiment and the case of applying the semiconductor device manufacturing method of the second embodiment.

Figure 9A:
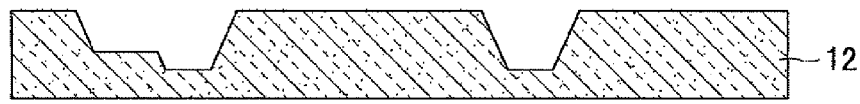
FIG. 9A is a diagram illustrating a substrate step forming process according to a semiconductor device manufacturing method of a fifth embodiment of the present invention.

FIG. 9A is a diagram illustrating a substrate step forming process according to the semiconductor device manufacturing method of the fifth embodiment. In the MEMS large-step device manufacturing method, first, large steps are formed in a semiconductor substrate 12. The steps may be formed in the semiconductor substrate 12 by etching capable of forming a deep trench, such as dry etching. In addition to a common semiconductor wafer, a silicon-on-insulator (SOI) substrate may also be used for the semiconductor substrate 12 as required.

Figure 9B:
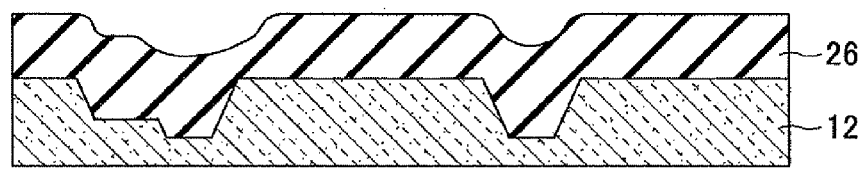
FIG. 9B is a diagram illustrating a thermal oxide film forming process according to the semiconductor device manufacturing method of the fifth embodiment of the present invention.

FIG. 9B is a diagram illustrating a thermal oxide film forming process according to the semiconductor device manufacturing method of the fifth embodiment. In the thermal oxide film forming process, the semiconductor substrate 12 is heated, so that a thermal oxide film 26 is formed on the surface of the semiconductor substrate 12. Since the surface of the semiconductor substrate 12 is stepped, the thermal oxide film 26 also is shaped to have an irregular surface in accordance with the steps. This process corresponds to the insulating film forming steps of the first through third embodiments.

Figure 9C:
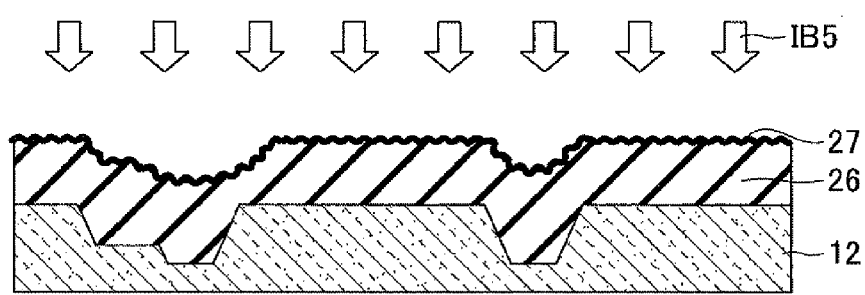
FIG. 9C is a diagram illustrating a first ion implantation process according to the semiconductor device manufacturing method of the fifth embodiment of the present invention.

FIG. 9C is a diagram illustrating a first ion implantation process according to the semiconductor device manufacturing method of the fifth embodiment. In the first ion implantation process, ion implantation is performed by irradiating the entire surface of the thermal oxide film 26 with an ion beam IB5. By the ion implantation, a damaged region 27 is formed in a region less than 10 nm deep from the surface of the thermal oxide film 26, so that the surface of the thermal oxide film 26 is activated. The details of the ion implantation are the same as those of the ion implantation process illustrated in the first embodiment and the first ion implantation process illustrated in the third embodiment, and accordingly, a detailed description thereof is omitted.

Figure 9D:
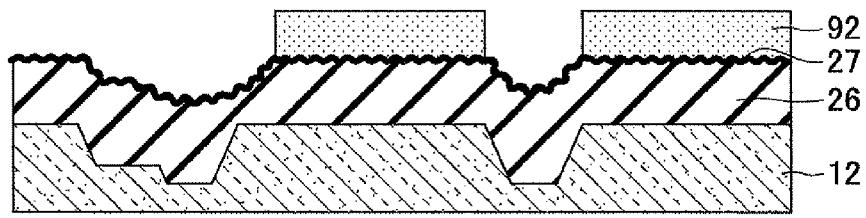
FIG. 9D is a diagram illustrating a photoresist pattern forming process according to the semiconductor device manufacturing method of the fifth embodiment of the present invention.

FIG. 9D is a diagram illustrating a photoresist pattern forming process according to the semiconductor device manufacturing method of the fifth embodiment. In the photoresist pattern forming process, a resist is applied on the thermal oxide film 26 to be formed into a photoresist pattern 92 through exposure to light and development. Since there is high adhesion between the damaged region 27 formed at the surface of the thermal oxide film 26 and the photoresist pattern 92, the photoresist pattern 92 is formed, adhering to the surface of the thermal oxide film 26. This process corresponds to the photoresist pattern forming processes of the first through third embodiments.

Figure 9E:
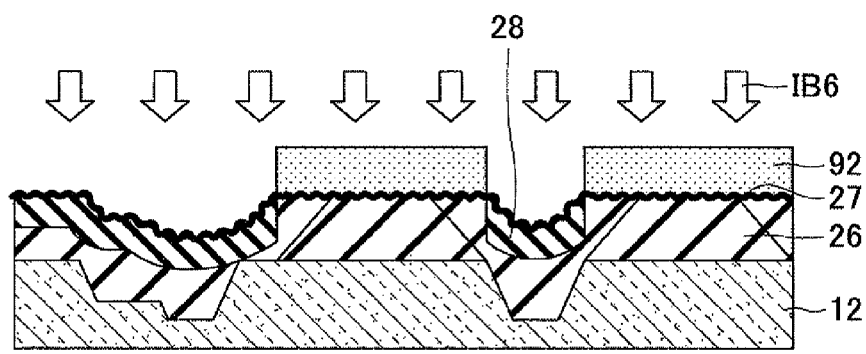
FIG. 9E is a diagram illustrating a second ion implantation process according to the semiconductor device manufacturing method of the fifth embodiment of the present invention.

FIG. 9E is a diagram illustrating a second ion implantation process according to the semiconductor device manufacturing method of the fifth embodiment. In the second ion implantation process, ion implantation is performed by irradiating an exposed part of the thermal oxide film 26 with an ion beam IB6. By the second ion implantation process, a damaged region 28 is formed in a region as deep as or deeper than 10 nm from the surface of the thermal oxide film 26. As a result, it is possible to control the taper angle.

The details of the second ion implantation process are the same as those of the ion implantation process of the second embodiment and the second ion implantation process of the third embodiment, and accordingly, a detailed description thereof is omitted.

Figure 9F:
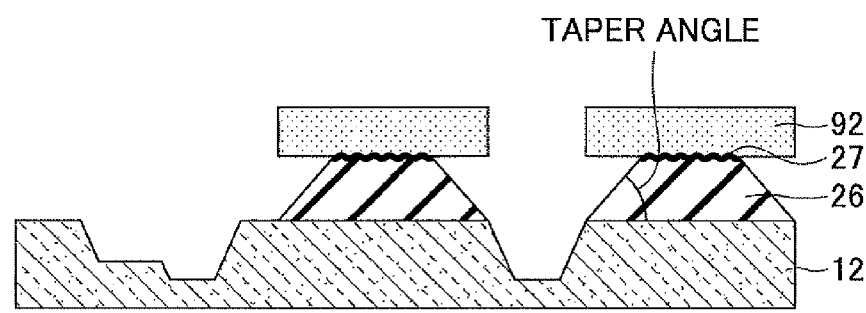
FIG. 9F is a diagram illustrating a wet etching process according to the semiconductor device manufacturing method of the fifth embodiment of the present invention.

FIG. 9F is a diagram illustrating a wet etching process according to the semiconductor device manufacturing method of the fifth embodiment. In the wet etching process, the thermal oxide film 26 is etched using an etchant, so that unnecessary portions of the thermal oxide film 26 are removed. Because of the effect of the activation of the thermal oxide film 26 in the first ion implantation process illustrated in FIG. 9C and in the second ion implantation process illustrated in FIG. 9E, it is possible to linearly taper the shape of the thermal oxide film 26 with a large taper angle as illustrated in FIG. 9F.

Figure 9G:
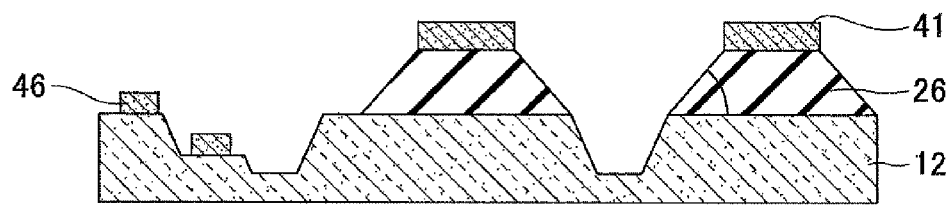
FIG. 9G is a diagram illustrating a gate forming process according to the semiconductor device manufacturing method of the fifth embodiment of the present invention.

FIG. 9G is a diagram illustrating a gate forming process according to the semiconductor device manufacturing method of the fifth embodiment. In the gate forming process, after removal of the photoresist pattern 92, gates 41 are formed on top flat portions of the thermal oxide film 26, and gates 46 are formed on the surface of the semiconductor substrate 12. Since the thermal oxide film 26 has a large taper angle and a linearly tapered shape, it is possible to form flat portions sufficient in area at the top of the thermal oxide film 26, thus allowing formation of the gates 41.

Figure 9H:
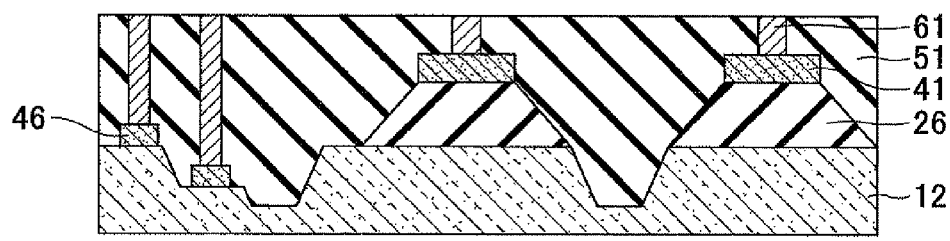
FIG. 9H is a diagram illustrating an interlayer film forming and contact hole forming process according to the semiconductor device manufacturing method of the fifth embodiment of the present invention.

FIG. 9H is a diagram illustrating an interlayer film forming and contact hole forming process according to the semiconductor device manufacturing method of the fifth embodiment. In the interlayer film forming and contact hole forming process, an interlayer film 51 is formed, and contact holes 61 are then formed on the gates 41 and 46 inside the interlayer film 51. As a result, it is possible to supply electricity to the gates 41 and 46.

Figure 9I:
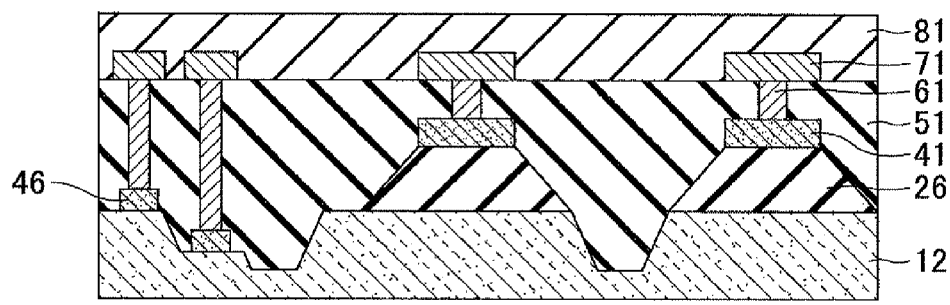
FIG. 9I is a diagram illustrating an interconnection layer forming and protection film forming process according to the semiconductor device manufacturing method of the fifth embodiment of the present invention.

FIG. 9I is a diagram illustrating an interconnection layer forming and protection film forming process according to the semiconductor device manufacturing method of the fifth embodiment. In the interconnection layer forming and protection film forming process, an interconnection layer 71 is formed on the contact holes 61, and the interconnection layer 71 is covered with a protection film 81. Thereby, a MEMS large-step device is completed.

In the MEMS large-step device as well, it is desired that the thermal oxide film 26 be so shaped that it is possible to ensure sufficient flat space at its top in order to form the gates 41 on the thermal oxide film 26. According to the semiconductor device manufacturing method of this embodiment, it is possible to linearly taper the shape of the thermal oxide film 26 and also to enlarge the taper angle. Therefore, it is possible to ensure sufficient area for top flat portions.

In order to apply the semiconductor device manufacturing method according to the first embodiment to the MEMS large-step device manufacturing method according to the fifth embodiment, the second ion implantation process of FIG. 9E may be omitted. Further, in order to apply the semiconductor device manufacturing method according to the second embodiment to the MEMS large-step device manufacturing method according to the fifth embodiment, the first ion implantation process of FIG. 9C may be omitted. If it is possible to process the thermal oxide film 26 into a shape having a desired taper angle by performing only one of the first ion implantation process and the second ion implantation process, the other one of the first ion implantation process and the second ion implantation process may be omitted. This makes it possible to simplify the manufacturing process.

Embodiments of the present invention may be applied to the manufacture of semiconductor devices including high-voltage devices and MEMS large-step devices.

According to an aspect of the present invention, a method of manufacturing a semiconductor device includes forming a photoresist pattern on an insulating film formed on a semiconductor substrate by applying a photoresist on the insulating film; processing the insulating film by removing an unnecessary portion of the insulating film by wet etching; and implanting ions into the insulating film before and/or after forming the photoresist pattern, wherein in implanting the ions, the depth of a damaged region formed in the insulating film by implanting the ions is changed in accordance with the presence or absence of the photoresist pattern.

This makes it possible to change the activation of the semiconductor substrate due to ion implantation in accordance with the presence or absence of the photoresist pattern, so that it is possible to perform processing suitable for a condition.

Additionally, in the method as set forth above, in implanting the ions, the depth of the damaged region may be set to be less than 10 nm from a surface of the insulating film when the ions are implanted before forming the photoresist pattern.

This makes it possible to increase adhesion between the insulating film and the photoresist pattern to be later formed without damaging the insulating film, so that it is possible to prevent excessive lateral progress in etching due to capillarity. As a result, it is possible to process the insulating film into a desired shape.

Additionally, in the method as set forth above, in implanting the ions, the depth of the damaged region may be set to be more than or equal to 10 nm from the surface of the insulating film and be less than or equal to the depth of the unnecessary portion of the insulating film when the ions are implanted after forming the photoresist pattern.

This makes it possible to activate part of the insulting film not covered with the photoresist pattern and to promote corrosion by wet etching, so that it is possible to perform wet etching with good efficiency.

Additionally, in the method as set forth above, the depth of the damaged region may be determined by controlling the dose and the accelerating voltage of an ion beam used in implanting the ions.

This makes it possible to control the damaged region of the insulating film with the settings of the irradiation conditions of the ion beam, so that it is possible to process the insulating film into a desired shape with good efficiency and high accuracy with relatively easy control.

Additionally, in the method as set forth above, the dose and the accelerating voltage may be determined based on the relationship between the dose and the accelerating voltage and the taper angle dependence of a shape into which the insulating film is processed by the wet etching.

This makes it possible to process the insulating film into a shape having a desired taper angle, and to perform processing with high accuracy.

Additionally, the method as set forth above may further include forming a gate on a top flat portion of the insulating film after processing the insulating film.

According to an aspect of the present invention, it is possible to process an insulating film into a desired shape and to manufacture highly accurate semiconductor devices.

The present invention is not limited to the specifically disclosed embodiments, and variations and modifications may be made without departing from the scope of the present invention.

What is claimed is:

1. A method of manufacturing a semiconductor device, comprising:
    forming a photoresist pattern on an insulating film formed on a semiconductor substrate by applying a photoresist on the insulating film;
    processing the insulating film by removing an unnecessary portion of the insulating film by wet etching;
    implanting ions into the insulating film at least one of before and after said forming the photoresist pattern; and
    forming a gate on a top flat portion of the insulating film after said processing the insulating film,
    wherein in said implanting the ions, a depth of a damaged region formed in the insulating film by implanting the ions is changed in accordance with a presence or absence of the photoresist pattern.

2. The method as claimed in claim 1, wherein in said implanting the ions, the depth of the damaged region is set to be less than 10 nm from a surface of the insulating film when the ions are implanted before said forming the photoresist pattern.

3. The method as claimed in claim 1, wherein in said implanting the ions, the depth of the damaged region is set to be more than or equal to 10 nm from a surface of the insulating film and be less than or equal to a depth of the unnecessary portion of the insulating film when the ions are implanted after said forming the photoresist pattern.

4. The method as claimed in claim 1, wherein the depth of the damaged region is determined by controlling a dose and an accelerating voltage of an ion beam used in said implanting the ions.

5. The method as claimed in claim 4, wherein the dose and the accelerating voltage are determined based on a relationship between the dose and the accelerating voltage and a taper angle dependence of a shape into which the insulating film is processed by the wet etching.

* * * * *